United States Patent [19]
Shannon

[11] Patent Number: 5,744,817
[45] Date of Patent: Apr. 28, 1998

[54] HOT CARRIER TRANSISTORS AND THEIR MANUFACTURE

[75] Inventor: John M. Shannon, Whyteleafe, England

[73] Assignee: U.S. Philips Corporation, New York, N.Y.

[21] Appl. No.: 762,688

[22] Filed: Dec. 11, 1996

[30] Foreign Application Priority Data

Dec. 16, 1995 [GB] United Kingdom .............. 9525784

[51] Int. Cl.$^6$ ................................................. H01L 29/06
[52] U.S. Cl. ........................... 257/29; 257/52; 257/485; 438/570
[58] Field of Search .......................... 257/29, 52, 485; 438/570

[56] References Cited

U.S. PATENT DOCUMENTS

| | | | |
|---|---|---|---|
| 3,747,203 | 7/1973 | Shannon | 29/578 |
| 4,492,971 | 1/1985 | Bean et al. | 357/15 |
| 4,707,197 | 11/1987 | Hensel et al. | 437/189 |
| 4,837,174 | 6/1989 | Peterson | 437/24 |
| 5,236,872 | 8/1993 | Van Ommen et al. | 437/200 |
| 5,290,715 | 3/1994 | Pandya | 437/29 |

OTHER PUBLICATIONS

The Physics of Semiconductor Devices, 1969 ed. by Wiley Inter-Science, by S.M. Sze, pp. 587–613. No Month.
Y. Masaki et al, Journal of Applied Physics, vol. 77, No. 6, Mar. 15, 1995, pp. 2474–2478.

*Primary Examiner*—Sara W. Crane
*Attorney, Agent, or Firm*—John C. Fox

[57] ABSTRACT

A hot carrier transistor can be formed with semiconductor thin-film technology, for example hydrogenated amorphous silicon (a-Si:H) technology as used for large-area electronics devices. The emitter and collector regions (2 and 3) comprise hydrogenated amorphous semiconductor material (a-Si:H) adjoining an intermediate semiconductor-rich amorphous metal-semiconductor alloy layer (a-Si$_{1-x}$M$_x$:H) which provides the base region 1. The amorphous nature of the alloy layer (1) and its low percentage of metal M, e.g 5%, presents a range of quantum mechanical environments for the hot carriers (21) through the base region (1) with spatial variations of wavelength and effective mass (m*$_1$, m*$_2$). The current transport through this base region (1) will therefore be spatially self-selective in that the carriers (21) will tend to pass through those areas where there is a resonance between the wave function, the barrier heights (h1,h2) and the base width (x1,x2). Passage through semiconductor environments of the semiconductor-rich alloy layer (1) reduces quantum mechanical reflections at the base-collector barrier.

14 Claims, 2 Drawing Sheets

5,744,817

HOT CARRIER TRANSISTORS AND THEIR MANUFACTURE

BACKGROUND OF THE INVENTION

This invention relates to hot carrier transistors comprising a metal-semiconductor alloy base region between semiconductor emitter and collector regions. Particularly, but not exclusively, the invention may provide a thin-film hot electron transistor having a metal-silicide base region. The invention also relates to methods of manufacturing such transistors.

Early experimental forms of hot electron transistors are described on pages 587 to 613 of the book by S. M. Sze entitled "The Physics of Semiconductor Devices", 1969 edition published by Wiley Inter-Science. In these early days, transistor structures were considered involving layers of metal and of insulator or semiconductor. A common feature of all these devices was that the base region was formed by a single sandwiched layer of metal. None of these structures were practical electronic components for use as a hot electron transistor. They were instead used to study fundamental physical parameters, for example hot-electron lifetime, electron-electron mean free path, base transport loss, and quantum-mechanical reflection at the metal and semiconductor interface. The whole contents of said pages 587 to 613 of the Sze book are hereby incorporated herein as reference material.

U.S. Pat. No. 4,492,971 describes an improved hot electron transistor comprising a metal-silicide base region between silicon emitter and collector regions. This transistor has an essentially monocrystalline structure comprising a monocrystalline silicon layer forming an emitter region epitaxially grown on a thin monocrystalline metal silicide layer which forms the base region and which is epitaxially grown on a monocrystalline silicon substrate forming the collector region. This composite structure has an essentially continuous single crystal lattice between the three layers. The thickness of the metal-silicide base layer is thin (typically 4, 6 or 8 nm) so as to be small compared with the hot electron scattering length in this silicide base material and is made a multiple of the quantum mechanical transmission probability factor. The emitter-base and base-collector junctions of the transistor are formed by Schottky barriers between the metal silicide base and the silicon emitter and collector regions. In order to maximise the cumulative quantum mechanical transmission probability QM, it is considered necessary to have a high degree of crystal perfection through the emitter, base and collector regions and to make the silicide base region thin.

U.S. Pat. Nos. 4,707,197, 4,837,174, 5,236,872, and 5,290,715 describe various forms and variations of such a metal-silicide base transistor, and various methods for the manufacture of such transistors. Thus, for example, the last three of these U.S. Patents discloses ion implantation methods for forming the metal-silicide base region. In all cases, the implanted structure is annealed by a prolonged heat treatment at a high temperature, for example, between 575° C. and 1000° C. in order to restore the crystalline quality of the emitter, base and collector regions. In the modification taught in U.S. Pat. No. 5,236,872, the silicon material is first rendered amorphous by implantation (for example of silicon ions), thereby providing a high solubility for the metal ions which are subsequently implanted to provide the silicide. The subsequent heat treatment at a high temperature is then carried out to form the silicide as a layer with a thickness smaller than that of the amorphous layer originally formed.

The whole contents of U.S. Pat. Nos. 4,492,971, 4,707,197, 4,837,174, 5,236,872, and 5,290,715 are hereby incorporated herein as reference material.

In these known hot electron transistors it is difficult to make the silicide base region sufficiently thin to avoid significant energy loss (termed "thermalisation") of the hot electrons before they enter the collector region. Significant quantum mechanical reflections occur at the collector barrier where the hot carriers pass from the silicide material of the base to the silicon material of the collector.

OBJECTS AND SUMMARY OF THE INVENTION

The present invention adopts a completely opposite approach in order to provide a hot carrier transistor comprising a silicon-rich metal-silicide base region with an adequate cumulative quantum mechanical transmission probability.

According to a first aspect of the present invention a hot carrier transistor comprising a metal-semiconductor alloy base region located between semiconductor emitter and collector regions and forming Schottky barriers with the emitter and collector regions is characterised in that the emitter and collector regions comprise hydrogenated amorphous semiconductor material adjoining an intermediate semiconductor-rich amorphous metal-semiconductor alloy layer which provides the base region.

Thus, contrary to the prior art approach of requiring a high degree of crystal perfection through a continuous single crystal lattice between the emitter, base and collector regions, the hot carrier transistor of the present invention is based on amorphous semiconductor material for the emitter, base and collector regions. Hydrogenation of this material reduces to an acceptable level the high density of defect states which naturally occur in amorphous semiconductor material and which otherwise lead to a high density of carrier traps at deep energy levels in the energy band gap. The hydrogen (which may be introduced either during the deposition of the material or in a subsequent hydrogenation process) attaches itself to unsaturated bonds throughout the bulk of the amorphous semiconductor material where the defect states occur. By this means, adequate charge-carrier transport through the emitter and collector regions can be achieved. Furthermore, the provision of the hydrogen in the amorphous semiconductor material is found to facilitate the formation therein or thereon of an amorphous metal-semiconductor alloy layer which can be very rich in the semiconductor element (i.e having a very dilute metal concentration) while still forming a Schottky barrier with the adjoining amorphous semiconductor region.

The semiconductor-rich metal-semiconductor alloy base region of the amorphous transistor structure in accordance with the present invention provides an important difference with respect to the emitter and collector barriers, as compared with the prior art approaches. Thus, hot carriers from the emitter of such a transistor in accordance with the present invention are presented with a range of quantum mechanical environments due to the amorphous nature of the base region which leads to spatial variations in wavelength and effective mass. The current transport through this base region will therefore be spatially self-selective, in that the hot carriers will tend to pass through those areas where there is a resonance between the wave function, the barrier heights and the base width. Furthermore, whereas significant quantum mechanical reflections occur at the base-collector metal-silicon or silicide-silicon hetero-junction of prior-art transistors, such reflections are reduced by the use of a semiconductor-rich metal-semiconductor alloy base region in accordance with the present invention, for example a silicon-rich amorphous silicide base layer in a silicon-based technology. Thus, the preferred routes for the hot carriers in a silicon example in accordance with the invention will be via a silicon environment in the amorphous silicon-rich base region, from the emitter region to the collector region.

Particularly with regard to the semiconductor-rich amorphous nature of the metal-semiconductor alloy base region in accordance with the invention, it is particularly advantageous for the emitter and collector regions to each comprise undoped or only lightly-doped hydrogenated amorphous material adjoining the intermediate silicide base layer. This undoped or lightly doped semiconductor material provides good electrical separation of the emitter and collector regions and facilitates the achievement of satisfactory barrier heights for emitter and collector Schottky barriers. Thus, as the doping concentration is increased then more defects are generally generated in the amorphous semiconductor material and the leakage current across the Schottky barrier increases.

A hot carrier transistor in accordance with the present invention is eminently suitable for fabrication using known silicon thin-film technology processes, and such a thin-film silicon hot carrier transistor may form part of a large-area electronic device manufactured using silicon thin-film technology. Thus, for example, the formation of silicon-rich amorphous silicide layers in a hydrogenated amorphous silicon material is described in the article "Interaction in the Cr/amorphous-silicon system" by Y. Masaki et al in Journal of Applied Physics, Vol 77, No 6, 15 Mar. 1995, pp 2474–2478. The whole contents of this Masaki et al article are hereby incorporated herein as reference material. Thin-film technology based on germanium is also known and may be used instead of (or in addition to) silicon thin-film technology to fabricate a thin-film hot carrier transistor in accordance with the invention. Indeed a more efficient hot-hole transistor in accordance with the invention may be produced with germanium thin-film technology rather than silicon thin-film technology.

Thus, according to a second aspect of the present invention there is provided a method of manufacturing an electronic device comprising a hot carrier transistor in accordance with a first aspect of the invention, characterised by steps which include depositing at least one amorphous semiconductor thin film for the emitter and collector regions, hydrogenating the amorphous thin-film material, and introducing metal atoms into a part of the amorphous semiconductor thin-film material to form a semiconductor-rich amorphous metal-semiconductor alloy layer for the base region, this layer being maintained at a temperature below 400° C. during the manufacture. A variety of specific processes may be used.

Thus, in one form the amorphous semiconductor-rich metal-semiconductor alloy layer may be formed by implanting atoms of at least one metal (for example from the group comprising chromium, cobalt, nickel, iron, iridium and platinum) within a part of the amorphous semiconductor thin-film material, at least adjoining parts of which may provide the emitter and collector regions. Ion implantation permits very precise control of the dose of metal atoms introduced into the amorphous semiconductor material to form the semiconductor-rich metal-semiconductor alloy.

In another form, the semiconductor-rich amorphous metal-semiconductor alloy may be formed between first and second amorphous semiconductor thin films by depositing metal on the first amorphous film introducing metal atoms from the deposited metal into the surface of the first film to form a semiconductor-rich amorphous interface layer (for example having a semiconductor content in excess of 90% over a thickness of less than 10 nm), etching away the remaining metal from the interface layer, and depositing the second amorphous semiconductor thin film on the interface layer. Because this second semiconductor film is provided after forming the alloy interface layer, the composition and layer structure of the second semiconductor film can be controlled more independently of the alloy formation process steps. The first semiconductor film may provide the emitter region, and the second semiconductor film may provide the collector region. However, it can be advantageous for the first semiconductor film to provide the collector region, and the second semiconductor film to provide the emitter region. In this case, the second film providing the emitter region may be of a semiconductor-rich alloy material having a wider energy bandgap, so as to improve the transistor efficiency.

At least one metal from the group comprising chromium, cobalt, nickel, iron, iridium and platinum may be used to form a metal-silicide as the alloy in the amorphous base layer in a manner compatible with known hydrogenated amorphous silicon thin-film technology. A dopant may also be included in the base layer, for example phosphorus, antimony or boron in a silicon-rich base layer.

BRIEF DESCRIPTION OF THE DRAWINGS

These and other features of the present invention, and their advantages, are illustrated specifically in embodiments of the invention now to be described, by way of example, with reference to the accompanying diagrammatic drawings, in which.

Figure 1:
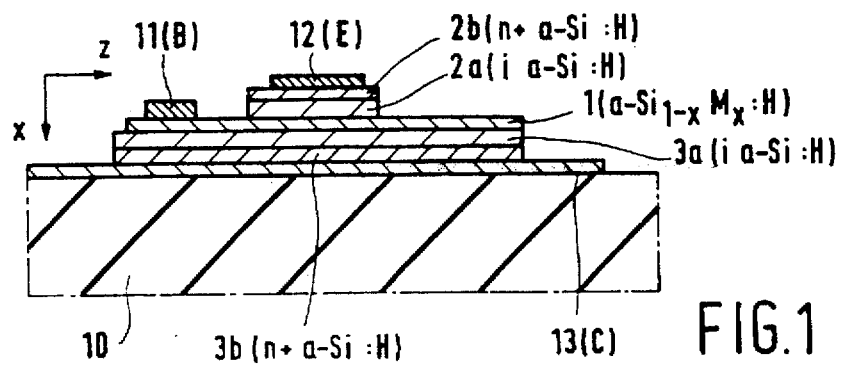
FIG. 1 is a cross-sectional view of a thin-film hot electron transistor in accordance with the present invention.

It should be noted that all the drawings are diagrammatic and not drawn to scale. Relative dimensions and proportions of parts of these Figures have been shown exaggerated or reduced in size for the sake of clarity and convenience in the drawings. The same reference signs are generally used to refer to corresponding or similar features in the different embodiments.

DESCRIPTION OF THE PREFERRED EMBODIMENTS

Figure 2:
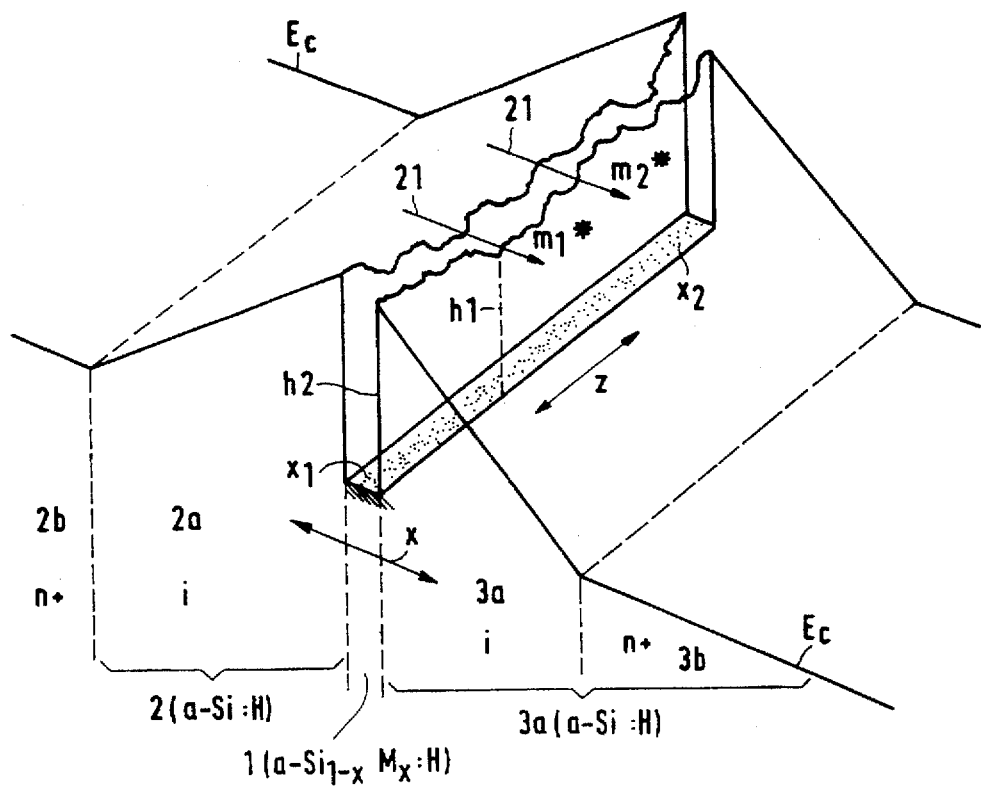
FIG. 2 is an energy diagram showing the conduction band edge $E_c$, through the active part of the transistor of FIG. 1, both in the direction of thickness x and in the sideways direction z.

FIGS. 1 and 2 illustrate a hot-electron transistor constructed with silicon thin-film technology in accordance with the present invention. The transistor comprises a metal-silicide base region 1 between silicon emitter and collector regions 2 and 3 respectively. The emitter and collector regions 2 and 3 are each of hydrogenated amorphous silicon material (a-Si:H) adjoining an intermediate silicon-rich amorphous silicide layer (a-Si$_{1-x}$M$_x$:H) which provides the base region 1. In the embodiment as illustrated in FIGS. 1 and 2, the emitter and collector regions 2 and 3 comprise an undoped or lightly doped part 2a and 3a respectively, and a heavily donor-doped part 2b and 3b respectively. The undoped or lightly doped hydrogenated amorphous silicon parts 2a,3a (i a-Si:H) (hereinafter simply referred to as "undoped" parts) adjoin the intermediate silicon-rich amorphous silicide layer 1 and are designated by i in FIGS. 1 and 2 to indicate intrinsic or very low conductivity. The heavily donor-doped hydrogenated amorphous silicon parts 2b,3b (n+a-Si:H) are designated by n+ to designate their high n-type conductivity. These donor-doped parts 2b,3b are contacted by respective emitter and collector electrodes 12,13 of the transistor. The intermediate silicon-rich amorphous silicide base layer 1 (a-Si$_{1-x}$M$_x$:H) is contacted by a base electrode 11. FIG. 1 illustrates the thin-film transistor fabricated on an insulating substrate 10 of a glass or other low-cost insulating material. This substrate 10 may form part of a large-area thin-film electronic device, for example a thin-film circuit plate of a flat-panel display or large-area image sensor.

Hot carrier transistors are also sometimes termed ballistic transistors. Current flow through a hot carrier transistor is by hot majority charge-carriers 21 of one conductivity type in the base region 1, from the emitter region 2 to the collector region 3. Hot charge-carriers are not in thermal equilibrium with the semiconductor material. Thus, the average energy of hot electrons is considerably more than a few k.T above the average energy of electrons in equilibrium with the semiconductor material, where k and T are the Boltzmann constant and the material temperature respectively. At room temperature k.T is about 25 meV. The electron mean free path in the silicide base 1 at room temperature exceeds the thickness of the silicide base region 1. Ballistic traversal of the silicide base region 1 by the hot electrons is extremely fast (of the order of 10$^{-14}$ seconds or less), since the electron velocity is of the order of the Fermi velocity in the silicide material, and the silicide layer 1 can be very thin (for example wholly contained within a layer thickness of less than 10 nm) due to the high conductivity of the silicide. Although it is unlikely that amorphous hot electron transistors can be designed for operation at high frequencies, they do permit the provision in a large-area thin-film technology electronic device of transistors having different characteristics from the thin-film field-effect transistors (TFTs) conventionally formed in such devices. Thus, whereas TFTs have a high input impedance at an insulated gate electrode, amorphous hot carrier transistors in accordance with the present invention can provide transistor characteristics with a low input impedance at their base electrode 11.

The new and advantageous nature of ballistic transport of the hot charge carriers 21 across the silicon-rich amorphous silicide base layer 1 of a hot carrier transistor in accordance with the present invention is illustrated in FIG. 2. In the prior art ballistic transistors of U.S. Pat. Nos. 4,492,971, 4,707, 197, 4,837,174, 5,236,872 and 5,290,715, there is substantial uniformity of the barriers and of the quantum mechanical environment between the crystalline silicide base region and crystalline silicon emitter and collector regions of these prior art transistors. By contrast therewith, FIG. 2 illustrates local variations which occur in this quantum mechanical environment in a transistor in accordance with the present invention, both in the direction of thickness x and in the sideways direction z. These variations result directly from the silicon-rich amorphous metal-semiconductor alloy nature of the base region 1 between the amorphous silicon material 2a and 3a of the emitter and collector regions 2 and 3. The spatial variation in this amorphous silicide base region 3 presents the hot electrons 21 from the emitter region 2 with a range of quantum mechanical environments. Thus, these hot electrons 21 are confronted by a wide range of conditions because of spatial variations in barrier height h1,h2, etc, wavelength and effective mass m*$_1$,m*$_2$, etc. Current transport through this amorphous metal-silicon alloy base region 3 will therefore be spatially selective, the hot electrons 21 tending to pass through those regions where there is a resonance between the wave function of the electron, the barrier heights h1,h2 etc of both the emitter and collector barriers and the base width x1,x2, etc of the silicide base region 1.

Suitable metals M for forming the silicon-rich amorphous silicide alloy a-Si$_{1-x}$M$_x$ may be selected from, for example, the group comprising Cr, Co, Ni, Fe, Ir and Pt. These metal atoms introduced into the amorphous silicon material (a-Si) appear to be located randomly through the silicon-rich material, although at least some of these metal atoms may group together with neighbouring silicon atoms to form metal-silicide molecules distributed in the amorphous material, for example, with molecular bonds such as CrSi$_2$, CoSi$_2$, NiSi$_2$, FeSi$_2$, IrSi$_3$ and PtSi. Because of the amorphous nature of the silicon-rich metal-silicon alloy base region 1, it is difficult to analyse precisely its constitution. The amorphous alloy base region 1 may be regarded as an interface layer having a silicon content which is typically in excess of 90% over a thickness which is typically less than 10 nm (nanometers). In a particular example, this amorphous interface layer 1 may have a similar composition to that of the Cr/a-silicon system described in the Masaki et al article. Thus, the silicide-metal M may be Cr, and the compositional ratio of Cr to Si in the amorphous interface layer formed by deposition thereon of a chromium layer may be about 5%, i.e the composition of the interface layer may be Cr$_5$Si$_{95}$:H. Such a Cr$_5$Si$_{95}$:H layer can be moderately conducting, for example with a resistivity of about 10$^{-3}$ Ωcm. It seems likely that its conducting properties arise from the close proximity of the individual metal atoms in the amorphous layer 1. As described on a microscopic scale, the silicide appears to be continuous in the z direction in order to exhibit the observed conducting properties. Thus, although the amorphous silicide layer 1 may appear to have a thickness in the range of 5 nm to 10 nm it seems likely that the metal silicon clusters are concentrated more closely together to form much narrower localised silicide sections of the base region, the thickness x of which varies randomly on the atomic scale as x$_1$,x$_2$ etc in the direction z. It is this spatial variation of the metal distribution in the silicon-rich alloy in both the x and z directions which gives rise to the above-mentioned range of quantum mechanical environments.

Use of a silicon-rich amorphous silicide for the base layer 1 provides Si—Si bond arrangements in the base region 1 that are similar to the Si—Si bond arrangements in the amorphous silicon emitter and collector regions 2 and 3. Thus, quantum mechanical reflections of the hot electrons 21 at the base-collector silicide-silicon hetero-junction are reduced, because the preferred routes for the hot electrons 21 will be via a silicon environment from the emitter region 2 to the collector region 3. The reduction of these quantum mechanical reflections improves the collector efficiency of the transistor. In order to improve further the conductivity of this silicon-rich base region 1, it is advantageous to also provide this alloy layer 1 with dopant determining the same conductivity type as that of the hot carriers through the base region 1. Thus, in the case of the hot electron transistor of FIGS. 1 and 2, donor dopant (such as, for example, phosphorus or antimony) may be incorporated in the layer 1. When this doped semiconductor-rich metal-semiconductor alloy layer 1 is formed on the collector region 3, it can be advantageous for the dopant to penetrate also the part 3a of the collector region at least adjoining the base region 1. Thus, for example, collector efficiency can be increased by having a slightly lower collector barrier (compared with the emitter barrier) as a result of lightly doping the collector region part 3a at the base region 1 while having an undoped emitter region part 2a.

Amorphous silicon material naturally has a high density of defect states, mainly due to silicon dangling bonds. Hydrogenation of this material reduces to an acceptable level this density of defect states and so reduces to an acceptable level the associated density of deep energy levels in the energy band gap of the amorphous silicon material. The hydrogen in the material attaches itself to the dangling bonds throughout the bulk of the material where the defect states occur, thereby permitting adequate electron transport through the emitter and collector regions 2 and 3. When the alloy base layer 1 is being formed on and/or in one of these regions 2 and 3, the hydrogen content of this region 2,3 also appears to play a significant role in achieving the desired highly-silicon-rich nature of the layer 1. The hydrogenation of the amorphous silicon material may occur during the deposition of the material, for example when the material is deposited by plasma-enhanced chemical-vapour deposition (PECVD) using $SiH_4$. However, the hydrogenation may be carried out subsequently, for example by exposing the deposited amorphous silicon material to a hydrogen plasma. The process parameters for controlling the hydrogen content of amorphous silicon material are known, for example as described in the Masaki et al article.

Figure 3:
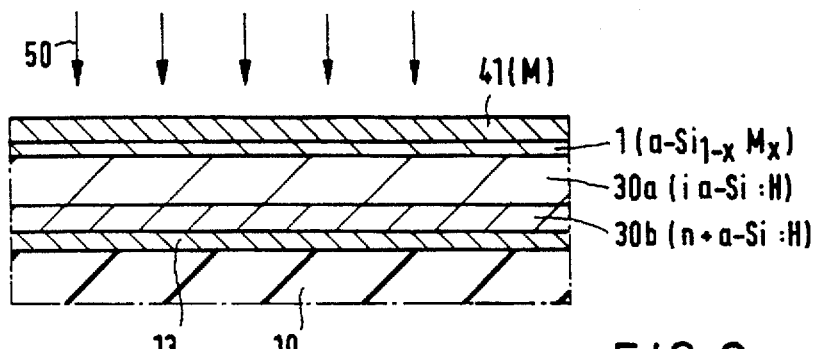
FIGS. 3 and 4 are two successive cross-sectional views of part of the transistor of FIG. 1 at two successive stages in its manufacture by one type of method in accordance with the present invention.
Figure 4:
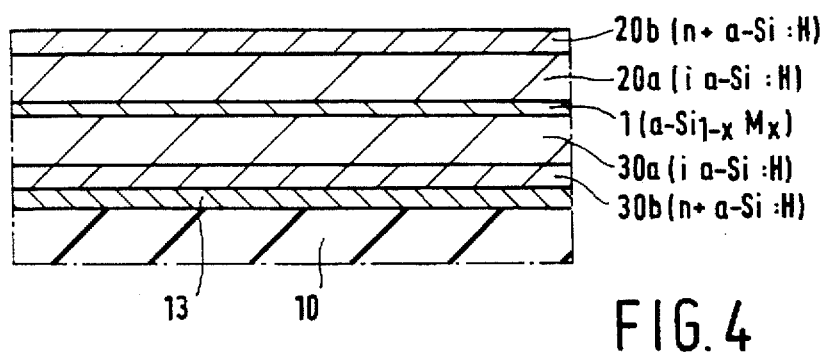

The hot electron transistor of FIGS. 1 and 2 may be fabricated using known amorphous silicon thin-film technologies. FIGS. 3 and 4 illustrate one such example. In the form illustrated in FIG. 3, an electrode film 13 is first deposited and patterned on the insulating substrate 10. The electrode film 13 may be of a metal such as, for example, chromium. Amorphous silicon material is then deposited by, for example, PECVD on the patterned electrode film 13 on the substrate 10. In the form illustrated in FIG. 3 this amorphous silicon material comprises an undoped film 30a on a film 30b heavily doped with arsenic or another suitable donor dopant. The amorphous silicon material 30 may be deposited at a temperature below 300° C., for example at about 250° C. The hydrogenation step may be carried out during the deposition. The hydrogen content of this silicon material 30a and 30b may be, for example, typically 20%. These films 30a and 30b may provide the collector region 3 of the transistor and typically may have thicknesses of 0.5 µm and 0.1 µm respectively.

FIG. 3 illustrates the formation of the silicon-rich amorphous silicide layer 1 in a subsequent stage of the manufacture. In this example, the layer 1 is formed by depositing a layer 41 of metal M on the first amorphous silicon film 30a,30b and then introducing metal atoms from the deposited metal M into the surface of the amorphous silicon film 30a. Recoil implantation, for example as described in U.S. Pat. No. 3,747,203 (our reference PHB 32012), may be used. The whole contents of U.S. Pat. No. 3,747,203 are hereby incorporated herein as reference material. Thus, for example, as illustrated by arrows 50 in FIG. 3, the layer 41 of deposited metal M may be bombarded with energetic ions 50, for example of xenon, argon or another inert gas, so that metal atoms M are introduced into the surface layer 1 by recoil from the implanted ions 50 in the layer 41. However, instead of recoil implantation, a step of heating the deposited metal M at a temperature below 400° C. or 300° C. may be carried out to introduce the metal atoms M in to the surface of the film 30a and so to form the silicon-rich alloy amorphous interface layer. Process parameters similar to those described in the Masaki article may be employed. Typically the resulting silicide interface layer 1 has a silicon content in excess of 90% over a thickness of less than 10 nm.

After forming the silicide interface layer 1 from the metal M of the metal layer 41, the remaining metal layer 41 is etched away from the interface layer 1. A second amorphous silicon thin-film 20a,20b is then deposited by, for example, PECVD on the exposed interface layer 1. In this way the silicide layer 1 is sandwiched between first and second amorphous silicon thin-films 20 and 30. The resulting structure is illustrated in FIG. 4.

Subsequently areas of the thin-films 20 and 30 are etched away to form the individual transistor body with exposed areas of the base silicide layer 1 and the collector electrode pattern 13. A metal film is then deposited and patterned to form the base and emitter electrodes 11 and 12. This metal film may be of, for example, chromium.

FIGS. 1 and 3 show only an area of the device substrate 10 where the hot electron transistor of FIGS. 1 and 2 is formed. In the case of a large-area electronic device, other circuit elements are generally formed on other areas of the substrate 10, for example conventional TFTs. A TFT of the known so-called "staggered" type may be formed from the films 30a,30b,13 at these other areas of the substrate 10. Thus, for example, the films 30b and 13 at these other areas may be patterned to form source and drain electrodes of the TFT before depositing the undoped film 30a (i a-Si:H). After forming the FIG. 4 structure, the film 30a may be re-exposed at the TFT areas by etching away the layers 1,20a and 20b at these areas. A dielectric layer and a metal gate may then be deposited in known manner on the exposed film area 30a to form an insulated gate of the TFT, whose channel region is provided by the film 30a. In the usual way, the individual TFT body is formed from the films 30a and 30b by etching, and metal-film connection tracks are provided between the individual circuit elements on the substrate 10.

Figure 5:
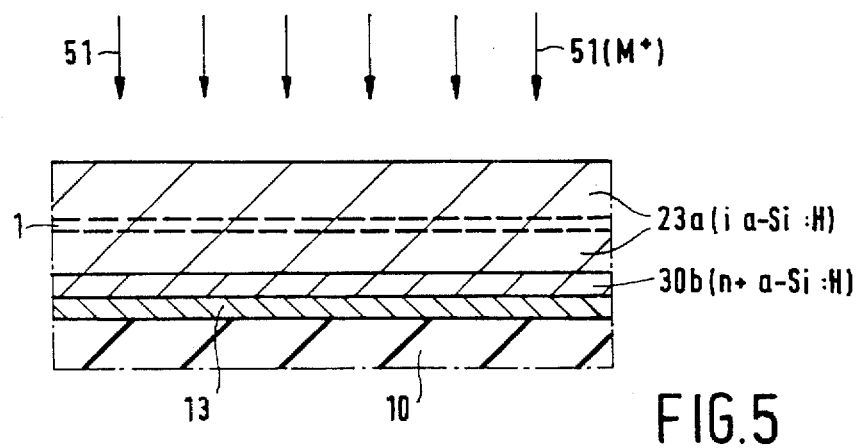
FIG. 5 is a cross-sectional view of part of the transistor of FIG. 1 at a stage in its manufacture by another type of method also in accordance with the present invention.

It will be evident that many modifications and variations are possible within the scope of the present invention. One such modification is illustrated in FIG. 5 in which the silicon-rich amorphous metal-silicon alloy layer 1 is formed by direct ion implantation. In this case, the doped amorphous silicon film 30b is deposited on the patterned electrode film 13 on the substrate 10 as in FIG. 3. However, a thicker undoped amorphous silicon film 23a i a-Si:H is then deposited, from which the emitter part 2a and at least a portion of the collector part 3a will subsequently be formed.

FIG. 5 illustrates the stage in which ions 51 of at least one metal M are implanted within a part of the amorphous silicon thin-film material 23a for providing the thin silicide layer 1. The actual formation of the silicide occurs when the implanted layer is annealed by heating at a temperature below 350° C. This annealing treatment may be carried out during the ion implantation or subsequently. Suitable metals for the ion implantation are, for example, chromium, cobalt, nickel, iron, iridium and platinum. Silicide layers 1 having very low resistivities can be formed in this way. Thus, for example, a resistivity of about $0.2 \times 10^{-3}$ Ωcm can be obtained by implanting cobalt in a-Si:H at room temperature. In addition to implanting ions 51 of the metal M, dopant ions 51 may also be implanted in the silicon-rich metal-silicon alloy layer 1 to increase its conductivity. Thus, for the hot electron transistor of FIGS. 1 and 2, phosphorus ions 51 or antimony ions 51 may also be implanted. This donor doping of the layer 1 may also be used to provide a light donor doping of the collector region part 3a (23a in FIG. 5), thereby permitting the collector barrier to be slightly lower than the emitter barrier for this transistor.

After the implantation step illustrated in FIG. 5, the remaining thickness of the undoped film 20a may be deposited, and then the heavily doped amorphous silicon film 20b is deposited to form a layer structure similar to that of FIG. 4. This layer structure is then further processed as for that of FIG. 4 to complete the hot carrier transistor of FIGS. 1 and 2.

The silicon-rich metal-silicon alloy interface layer 1 of FIGS. 3 and 4 may also be doped with phosphorus or antimony, i.e with dopant determining the same conductivity type as that of the hot carriers (electrons) through the transistor base region 1. This may be effected by implantation of very low energy dopant ions after removing the remaining metal film 41 of FIG. 3 or by implantation of more energetic dopant ions when the metal film 41 is still present on the surface.

One important advantage of the method of FIGS. 3 and 4 over that of FIG. 5 is that the whole of the emitter region part 2a (20a) may be deposited to have different material properties from those of the collector region part 3a (30a). Thus, for example, the emitter region 2 may comprise a hydrogenated amorphous semiconductor alloy material having a wider energy bandgap than that of the hydrogenated amorphous semiconductor material (a-Si:H) of the collector region 3. The semiconductor alloy may be based on the same semiconductor element as the collector region 3 and the base region 1, so maintaining a relatively simple manufacturing technology. Thus, for example, the emitter region films 20a and 20b may be of silicon-rich amorphous silicon carbide (a-SiC$_y$:H) or amorphous silicon-rich silicon-nitride (a-SiN$_y$:H).

In the transistors described so far with reference to the drawings, the emitter comprises an undoped or lightly-doped semiconductor part 2a adjacent the metal-semiconductor alloy base region 1, and a heavily donor-doped semiconductor part 2b adjacent a metal electrode 12. In order to raise the emitter barrier (and hence permit the injection of hotter electrons into the base region 1), it can be advantageous to replace the heavily donor-doped semiconductor part 2b with a thin dielectric layer (for example SiO$_2$ or Si$_3$N$_4$) through which the electrons can tunnel at high fields. Thus, in this modification the emitter may be an MIS structure (metal-insulator-semiconductor) comprising a metal electrode 12, an insulating film 2b and an undoped or lightly-doped hydrogenated amorphous semiconductor part 2 which forms a Schottky barrier with the metal-semiconductor alloy base region 1.

The ion implantation step illustrated in FIG. 5 is carried out into amorphous-silicon thin-film material 23a on an insulating substrate 10. However, an amorphous-silicon hot electron transistor in accordance with the present invention may be formed by a similar ion implantation processes into monocrystalline silicon material 23a epitaxially grown on a monocrystalline substrate. In this case, the amorphous silicon material of the base, emitter and collector regions 1 to 3 can be formed by ion implantation damage of the silicon crystal lattice. This amorphous silicon material may be hydrogenated by heating to, for example, about 300° C. in a hydrogen plasma.

FIG. 1 illustrates the formation of the base electrode connection by locally removing the amorphous silicon film 2 from the amorphous silicide layer 1. However, alternative connection arrangements are possible. Thus, for example, the base electrode 11 may be of metal alloyed at low temperature through the thickness of the amorphous silicon thin-film 2 to form a metal-rich region contacting the silicide base region 1.

FIGS. 1 to 5 have illustrated the construction of a hot electron transistor in accordance with the present invention. However, hot hole transistors may also be fabricated in accordance with the present invention, by replacing the donor-doped thin-film material 2b and 3b with p-type material. Boron is a suitable acceptor dopant for hydrogenated amorphous silicon material. An amorphous germanium thin-film technology (based on a-Ge:H) may be used for a hot hole transistor, rather than the a-Si:H technology described in all the embodiments so far.

From reading the present disclosure, other variations and modifications will be apparent to persons skilled in the art. Such variations and modifications may involve equivalent and other features which are already known in silicon thin-film technology and in the design, manufacture and use of hot-carrier transistors, and which may be used instead of or in addition to features already described herein. Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention. The Applicants hereby give notice that new Claims may be formulated to such features and/or combinations of such features during the prosecution of the present Application or of any further Application derived therefrom.

I claim:

1. A hot carrier transistor comprising a metal-semiconductor alloy base region located between semiconductor emitter and collector regions and forming Schottky barriers with the emitter and collector regions, characterised in that the emitter and collector regions comprise hydrogenated amorphous semiconductor material adjoining an intermediate semiconductor-rich amorphous metal-semiconductor alloy layer which provides the base region.

2. A hot carrier transistor as claimed in claim 1, further characterised in that the emitter region comprises undoped hydrogenated amorphous silicon material adjoining an intermediate silicon-rich amorphous silicide layer which provides the base region.

3. A hot carrier transistor as claimed in claim 2, further characterised in that the silicon-rich amorphous silicide layer which provides the base region is present at an interface between two thin films of hydrogenated amorphous silicon respectively of the emitter and collector regions, and this interface layer has a silicon content in excess of 90% over a thickness of less than 10 nm (nanometers).

4. A hot carrier transistor as claimed in claim 2, further characterised in that at least one metal from the group comprising chromium, cobalt, nickel, iron, iridium and platinum forms the metal-silicide in the amorphous silicide layer.

5. A hot carrier transistor as claimed in claim 1, further characterised in that the emitter region comprises a hydrogenated amorphous semiconductor alloy material having a wider energy bandgap than that of the hydrogenated amorphous semiconductor material of the collector region.

6. A hot carrier transistor as claimed in claim 1, further characterised in that dopant determining the same conductivity type as that of the hot carriers through the base region is present in the semiconductor-rich amorphous metal-semiconductor alloy layer which provides the base region.

7. A hot carrier transistor as claimed claim 1, further characterised in that the emitter and collector regions each comprise a donor-doped area of the hydrogenated amorphous semiconductor material which is contacted by respective emitter and collector electrodes, the transistor being a hot electron transistor.

8. A method of manufacturing an electronic device comprising a hot carrier transistor as claimed in claim 1, characterised by steps which include depositing at least one amorphous semiconductor thin film for the emitter and collector regions, hydrogenating the amorphous semiconductor thin-film material, and introducing metal atoms into a part of the amorphous semiconductor thin-film material to form a semiconductor-rich amorphous metal-semiconductor alloy layer for the base region, the semiconductor-rich amorphous metal-semiconductor alloy layer being maintained at a temperature below 400° C. during the manufacture.

9. A method as claimed in claim 8, further characterised in that the semiconductor-rich amorphous metal-semiconductor alloy layer is formed between first and second amorphous semiconductor thin films by depositing metal on the first amorphous semiconductor film, introducing metal atoms from the deposited metal into the surface of the first amorphous semiconductor film to form a semiconductor-rich amorphous interface layer having a semiconductor content in excess of 90% over a thickness of less than 10 nm (nanometers), etching away the remaining metal from the interface layer, and depositing the second amorphous semiconductor thin film on the interface layer.

10. A method as claimed in claim 9, further characterised in that the metal atoms are introduced into the surface of the first amorphous semiconductor film by heating the deposited metal at a temperature below 400° C. or by recoil from implantation of ions in the deposited metal.

11. A hot carrier transistor as claimed in claim 3, further characterized in that at least one metal from the group comprising chromium, cobalt, nickel, iron, iridium and platinum forms the metal-silicide in the amorphous silicide layer.

12. A hot carrier transistor as claimed in claim 2, further characterised in that the emitter region comprises a hydrogenated amorphous semiconductor alloy material having a wider energy bandgap than that of the hydrogenated amorphous semiconductor material of the collector region.

13. A hot carrier transistor as claimed in claim 2, further characterized in that dopant determining the same conductivity type as that of the hot carriers through the base region is present in the semiconductor-rich amorphous metal-semiconductor alloy layer which provides the base region.

14. A hot carrier transistor as claimed in claim 2, further characterized in that the emitter and collector regions each comprise a donor-doped area of the hydrogenated amorphous semiconductor material which is contacted by respective emitter and collector electrodes, the transistor being a hot electron transistor.

* * * * *